United States Patent
Kondo

(10) Patent No.: US 8,316,069 B2
(45) Date of Patent: Nov. 20, 2012

(54) SEMICONDUCTOR INTEGRATED CIRCUIT WITH A RANDOM NUMBER GENERATION CIRCUIT WHEREIN THE RISE AND ALL TIMES ARE VARIABLY CONTROLLED

(75) Inventor: Hideo Kondo, Gunma (JP)

(73) Assignees: SANYO Semiconductor Co., Ltd., Gunma (JP); Semiconductor Components Industries, LLC, Phoenix ( * ) Notice: Subject to any disclaimer, the term of this patent is extended or adjusted under 35 U.S.C. 154(b) by 1077 days.

(21) Appl. No.: 12/248,551

(22) Filed: Oct. 9, 2008

(65) Prior Publication Data
US 2009/0100119 A1 Apr. 16, 2009

(30) Foreign Application Priority Data
Oct. 12, 2007 (JP) ................. 2007-266858

(51) Int. Cl.
*G06F 7/48* (2006.01)
(52) U.S. Cl. ........ 708/250; 708/255; 708/801; 714/724; 714/739
(58) Field of Classification Search ............... 708/250, 708/255; 714/724, 739
See application file for complete search history.

(56) References Cited

U.S. PATENT DOCUMENTS

| | | | | |
|---|---|---|---|---|
| 5,825,888 A * | 10/1998 | Kimura et al. | ................. | 380/270 |
| 5,961,577 A | 10/1999 | Soenen et al. | | |
| 6,832,231 B1 * | 12/2004 | Jiang et al. | ................. | 708/252 |
| 6,886,023 B2 * | 4/2005 | Lundberg | ................. | 708/251 |
| 7,148,755 B2 | 12/2006 | Naffziger et al. | | |
| 7,653,855 B2 * | 1/2010 | Yasuda et al. | ................. | 714/739 |
| 7,868,604 B2 | 1/2011 | Tran et al. | | |
| 7,956,920 B2 * | 6/2011 | Shimono et al. | ................. | 348/312 |
| 8,032,574 B2 * | 10/2011 | Yamamoto et al. | ................. | 708/250 |
| 2007/0067375 A1 * | 3/2007 | Inaoka et al. | ................. | 708/250 |
| 2007/0210776 A1 | 9/2007 | Oka | | |
| 2009/0100117 A1 | 4/2009 | Kondo | | |

FOREIGN PATENT DOCUMENTS

JP 2003-153526 5/2003
JP 2003196081 * 7/2003

OTHER PUBLICATIONS

Kondo, U.S. Office Action mailed Mar. 29, 2012, directed to U.S. Appl. No. 12/248,511; 8 pages.

* cited by examiner

*Primary Examiner* — Tammara Peyton
(74) *Attorney, Agent, or Firm* — Morrison & Foerster LLP

(57) ABSTRACT

The invention reduces unnecessary electromagnetic radiation noise associated with a step pulse of an output signal. A random number control register is a register for controlling start, standby, stop, timing or the like of output of random number data from a random number generation circuit. Random number data outputted by the random number generation circuit is stored in a rise/fall time variable data register. The data stored in the rise/fall time variable data register is replaced by random number data sequentially generated by the random number generation circuit. An output circuit is a circuit for outputting a signal from an internal circuit of a microcomputer to an external device, and the rise/fall times of the output signal from the output circuit are variably controlled in response to the random number data stored in the rise/fall time variable data register.

6 Claims, 3 Drawing Sheets

SEMICONDUCTOR INTEGRATED CIRCUIT WITH A RANDOM NUMBER GENERATION CIRCUIT WHEREIN THE RISE AND ALL TIMES ARE VARIABLY CONTROLLED

CROSS-REFERENCE OF THE INVENTION

This application claims priority from Japanese Patent Application No. 2007-266858, the content of which is incorporated herein by reference in its entirety.

BACKGROUND OF THE INVENTION

1. Field of the Invention

The invention relates to a semiconductor integrated circuit having an output circuit.

2. Description of the Related Art

In general, a semiconductor integrated circuit has an internal circuit and an output circuit, and various control signals generated by the internal circuit are supplied as output signals to an external device through the output circuit. The output circuit is formed of a switching circuit. The output signal is thus a signal alternating between a high level and a low level, and its transition portion between the low level and the high level forms a step pulse and contains various frequency components (harmonic components) by the Laplace transformation or Fourier transformation. Since such frequency components of the step pulse induce electromagnetic radiation noise by its relation with the output impedance of the output circuit, the circuit is designed so as to provide the output impedance with a suitable value.

A switching regulator circuit in which electromagnetic radiation noise due to a switching noise is reduced is described in Japanese Patent Application Publication No. 2003-153526.

However, the built-in control of the output impedance of the output circuit described above makes the rise and fall times of the output signal constant. In other words, the rise and fall slopes of the output signal are made constant. Then, the step pulse of the output signal still has specific frequency components after all, and this causes electromagnetic radiation noise (power supply noise, signal radiation noise).

On the other hand, a reference clock with a small frequency drift is needed for an application device such as a tuner, an imaging system or the like. Such a reference clock is likely to be influenced by electromagnetic radiation noise associated with the output signal (the step pulse) of the output circuit, causing a problem for the application.

SUMMARY OF THE INVENTION

The invention provides a semiconductor integrated circuit that includes a random number generation circuit generating random number data, a control register storing the random number data outputted by the random number generation circuit, and an output circuit outputting an output signal. The rise and fall times of the output signal are variably controlled in response to the random number data stored in the first control register.

DETAILED DESCRIPTION OF THE INVENTION

Figure 1:
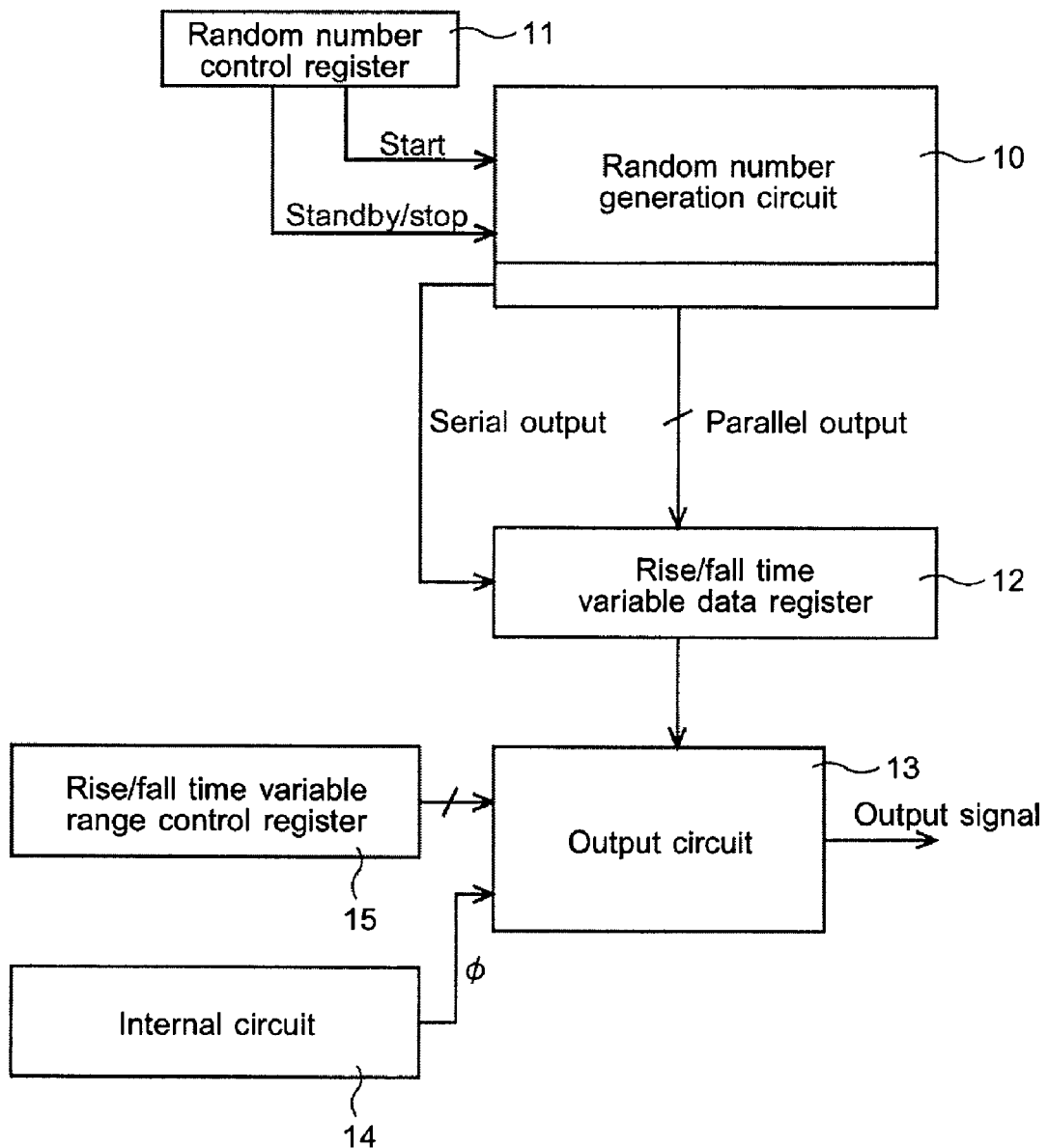
FIG. 1 is a diagram showing a structure of a semiconductor integrated circuit of an embodiment of the invention.

A semiconductor integrated circuit of an embodiment of the invention will be described referring to figures. FIG. 1 is a diagram showing the structure of the semiconductor integrated circuit of the embodiment of the invention. Hereafter, the descriptions will be given using a microcomputer as an example. A random number generation circuit 10 is a circuit sequentially generating n-bit random number data. A random number control register 11 is a register for controlling the start, standby, stop, timing or the like of the output of the random number data from the random number generation circuit.

The random number data is an n-bit data corresponding to a number randomly generated. As an example, 8-bit random number generation is explained. In this 8-bit scheme, 256 different numbers are generated, i.e., (00000000)-(11111111). These 256 numbers are randomly generated as 8-bit data.

Random number data outputted by the random number generation circuit 10 is stored in a rise/fall time variable data register 12 (an example of a first control register of the invention). The data stored in the rise/fall time variable data register 12 is replaced by random number data sequentially generated by the random number generation circuit 10.

It is noted that the random number data from the random number generation circuit 10 is stored in the rise/fall time variable data register 12 as a serial output or a parallel output, and these serial output and parallel output are arbitrarily selected.

An output circuit 13 is a circuit for outputting a signal φ from an internal circuit 14 of the microcomputer to an external device, and the rise/fall times of the output signal from the output circuit 13 are variably controlled in response to the random number data stored in the rise/fall time variable data register 12.

A rise/fall time variable range control register 15 (an example of a second control register of the invention) is further provided, which stores control data for controlling the ranges of the rise and fall times of the output signal, the rise and fall times being variably controlled in response to the random number data stored in the rise/fall time variable data register 12.

How the rise/fall times of the output signal are variably controlled in response to the random number data is explained. In the 8-bit random number data generation example explained above, the random number itself is not used. Rather, how many "1"s exist in the 8-bit random number data is determined. For example, there is no "1" in (00000000) and there are eight "1"s in (11111111). The occurrence of four "1"s are the most frequent, i.e., (01010101), (11110000) and the like. It is known that when the number of bit is large, for example 1000-bit random number data, the distribution of random number data sorted by the number of "1"s in the data becomes a normal distribution. It is desirable to use random number data of large bits so as to have a normal distribution.

Figure 2:
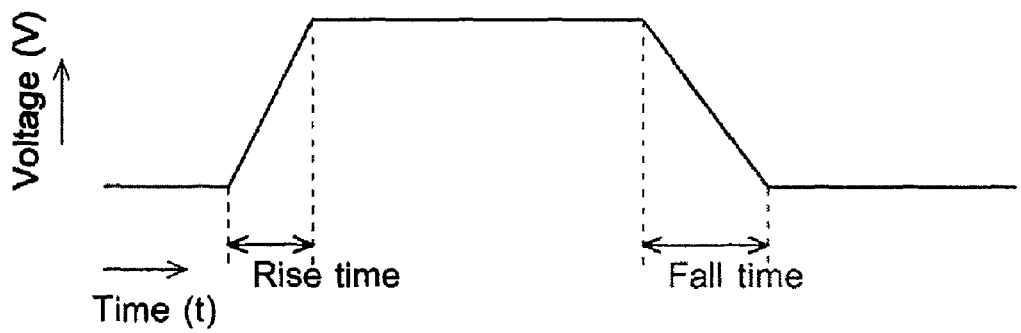
FIG. 2 is a diagram for explaining rise/fall times of an output signal.
Figure 3:
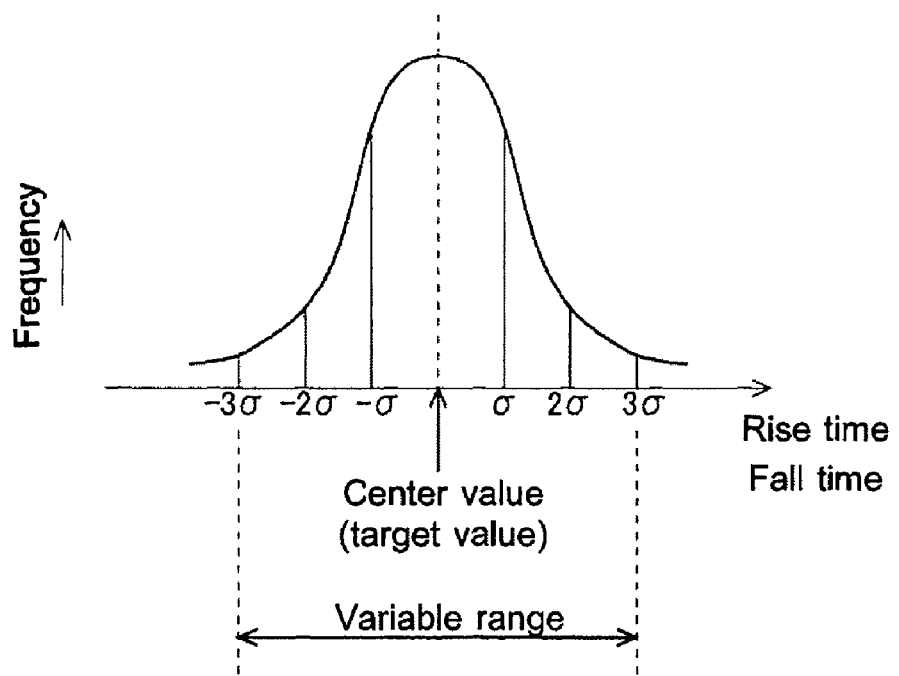
FIG. 3 is a graph showing a distribution of rise/fall times of an output signal.

By using the number of "1"s in the random number data, and not the number itself, as the basis for controlling the rise/fall times of the output signal, the generated the rise/fall times have normal distribution, such as the one shown in FIG. 3. Specifically, in this embodiment, the rise/fall times of the output signal shown in FIG. 2 are made proportional to the number of "1"s in the random number data by the output circuit 13. Furthermore, the rise/fall times variable range control register 15, in this embodiment, stores the range of the normal distribution for generating the rise/fall times of the output signal. For example, when it has $2\sigma$, the output circuit 13 uses only the $2\sigma$ distribution portion of the number distribution determined by the number of "1"s in the random number data. As a result, only the $2\sigma$ distribution portion of the rise/fall times of the output signal is generated.

As an alternate embodiment, the output circuit 13 can use the random number data itself, and not the number of "1"s in the data, to control the rise/fall times of the output signal. In this case, the distribution of the random number is flat, and thus the distribution of the rise/fall times becomes flat. In the example of the 8-bit random number data, the value at the center of the number distribution is 128=(10000000), and the numbers are evenly distributed around the center value. As a result, the distribution of the rise/fall times has the same distribution.

As shown in FIG. 2, the rise time of the output signal is defined as a transition time of the output signal from a low level to a high level, and the fall time of the output signal is defined as a transition time of the output signal from the high level to the low level. However, other definition may be employed. For example, the rise time of the output signal may be defined as a transition time of the output signal from a low level to the 90% level of a high level, and the fall time of the output signal may be defined as a transition time of the output signal from the high level to the 10% level of the high level. Furthermore, the rise/fall times of the output signal may be replaced by the slopes of the output signal as a similar concept.

With the circuit structure described above, the rise time of the output signal (the slope of the output signal) is variably controlled in response to the random number data, and has a distribution instead of being constant like in the conventional structure. The state of the distribution is adjusted by the random number data generated by the random number generation circuit 10. This provides the step pulse of the output signal with distributed frequency components and reduces electromagnetic radiation noise. Furthermore, this prevents an interference phenomenon between a reference clock used for an application device such as a tuner, an imaging system or the like and the output signal (the step pulse) of the output circuit.

The distribution of the rise/fall times of the output signal is preferably a normal distribution as shown in FIG. 3. In this case, the rise/fall times are distributed relative to a center value (a target value), and these variable ranges (distribution ranges) are controlled by the rise/fall time variable range control register 15. For example, the variable range is defined by $3\sigma$. It is noted that "$\sigma$" is a standard deviation of the normal distribution.

Figure 4:
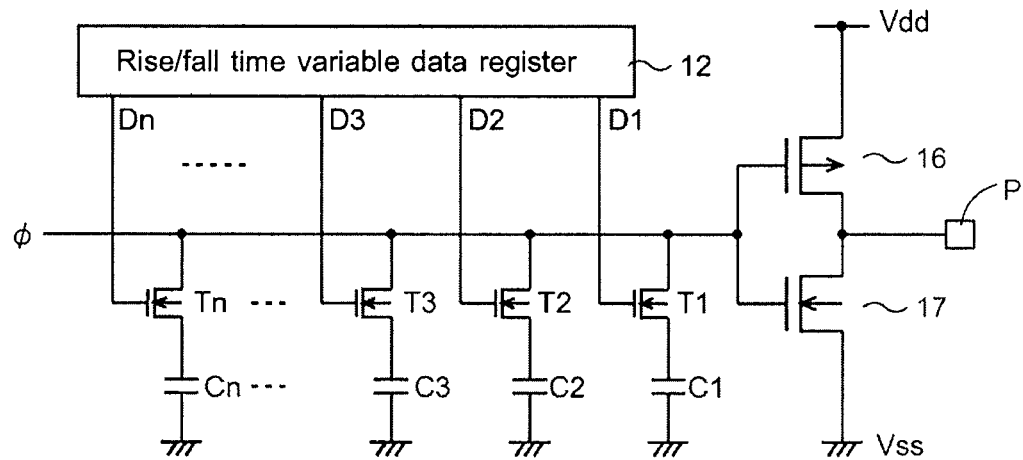
FIG. 4 is a circuit diagram of an output circuit.

FIG. 4 is a circuit diagram showing the detailed structure of the output circuit. The output buffer is formed of an inverter formed of a P-channel type MOS transistor 16 and an N-channel type MOS transistor 17. A signal $\phi$ from the internal circuit 14 is supplied to the gates of the P-channel type MOS transistor 16 and the N-channel type MOS transistor 17 (the input terminal of the output buffer). The P-channel type MOS transistor 16 and the N-channel type MOS transistor 17 are connected between a power potential Vdd and a ground potential Vss.

Drains of switching control N-channel type MOS transistors T1 to Tn are connected to the gates, corresponding to the bit (n bits) of the rise/fall time variable data register 12. Corresponding levels of voltages to the random number data D1 to Dn (D1 is least significant bit data and Dn is most significant bit data) stored in the rise/fall time variable data register 12 are applied to the gates of the switching control N-channel type MOS transistor T1 to Tn.

For example, when the random number data D1 is "1", a high level voltage is applied to the N-channel type MOS transistor T1 and the N-channel type MOS transistor T1 turns on. When the random number data D1 is "0", a low level (ground level) voltage is applied to the N-channel type MOS transistor T1 and the N-channel type MOS transistor T1 turns off. Furthermore, n capacitors C1 to Cn are connected between the sources of the switching control N-channel type MOS transistors T1 to Tn and the ground.

With this structure, the rise/fall times of the output signal outputted from the output terminal P of the output buffer are variably controlled by delaying the rise and fall of the input signal $\phi$ in response to the random number data stored in the rise/fall time variable data register 12. In other words, the switching control N-channel type MOS transistors T1 to Tn and the n capacitors C1 to Cn form a delay circuit in which the delay time is variable.

The output circuit 13 shown in FIG. 4 controls the rise/fall times of the output signal as follows. A voltage corresponding to each bit of the random number data stored in the data resister 12 is applied to a gate of a corresponding MOS transistor Tx. In this embodiment, all the capacitors C1-Cn have the same capacitance. Thus, the total capacitance of the delay circuit is determined by the number of "1"s in the random number data, and not by the number itself. For example, (01010101) and (11110000) are equal as far as generating a rise/fall time. Accordingly, the normal distribution shown in FIG. 3 is generated.

On the other hand, when the capacitors C1-Cn are weighted by the weights of the bits, the total capacitance of the delay circuit is determined by the number itself, and not by the number of "1"s in the random number data. As a result, a flat distribution of the rise/fall times is obtained, as explained above.

For example, when all the random number data D1 to Dn are "1", all the switching control N-channel type MOS transistors T1 to Tn turn on, and all the capacitors C1 to Cn are connected to the input terminal of the output buffer formed of the P-channel type MOS transistor 16 and the N-channel type MOS transistor 17. At this time, the capacitance load becomes maximum, and thus the rise/fall times of the output signal become longest.

When all the random number data D1 to Dn are "0", all the switching control N-channel type MOS transistors T1 to Tn turn off and any of the capacitors C1 to Cn is not connected to the input terminal of the output buffer. At this time, since the capacitance load becomes minimum, the rise/fall times of the output signal become shortest.

Figure 5:
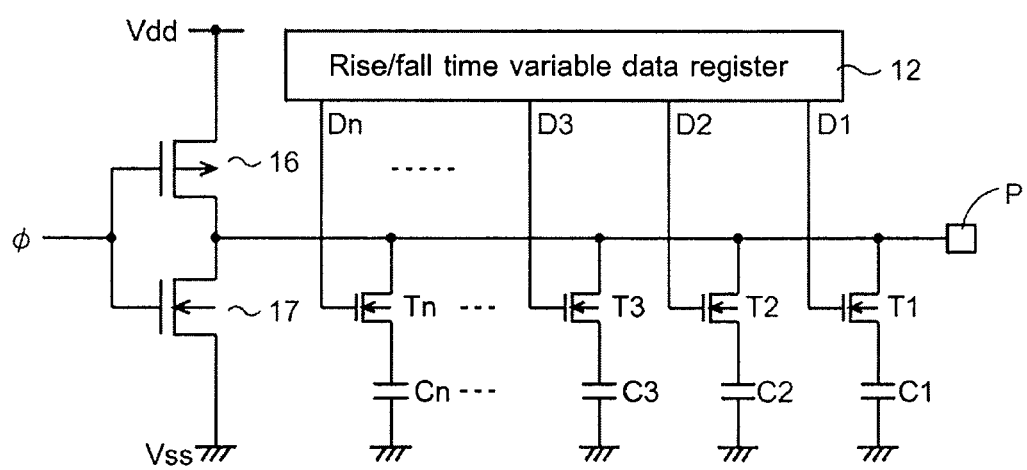
FIG. 5 is other circuit diagram of an output circuit.

Although the delay circuit formed of the switching control N-channel type MOS transistors T1 to Tn and the n capacitors C1 to Cn is provided on the input side of the output buffer, the rise/fall times of the output signal are variably controllable in the similar manner even when the delay circuit is provided on the output side of the output buffer as shown in FIG. 5.

The reduction of unnecessary electromagnetic radiation noise associated with the step pulse of an output signal is achieved. In particular, the interference phenomenon between a reference clock used for application of a tuner, an imaging system or the like and an output signal (the step pulse) of an output circuit is prevented.

What is claimed is:

1. A semiconductor integrated circuit comprising:
a random number generation circuit generating random number data; a first control register storing the random number data outputted by the random number generation circuit; and an output circuit outputting an output signal, wherein rise and fall times of the output signal are variably controlled in response to the random number data stored in the first control register; and further comprising a second control register storing control data for controlling ranges of the rise and fall times of the output signal which are variably controlled in response to the random number data stored in the first control register.

2. The semiconductor integrated circuit of claim 1, wherein the output circuit comprises an output transistor outputting the output signal and a delay circuit delaying a signal applied to an input terminal of the output transistor in response to the random number data stored in the first control register.

3. The semiconductor integrated circuit of claim 2, wherein the delay circuit comprises a plurality of capacitor elements and a plurality of switching elements switching in response to the random number data stored in the first control register and selectively connecting the capacitor elements to the input terminal of the output transistor.

4. The semiconductor integrated circuit of claim 1, wherein the output circuit comprises an output transistor outputting the output signal and a delay circuit delaying the output signal in response to the random number data stored in the first control register.

5. The semiconductor integrated circuit of claim 4, wherein the delay circuit comprises a plurality of capacitor elements and a plurality of switching elements switching in response to the random number data stored in the first control register and selectively connecting the capacitor elements to an output terminal of the output transistor.

6. The semiconductor integrated circuit of claim 1, wherein the output circuit uses the random number data so that the rise and fall times of the output signal form a normal distribution.

* * * * *